(12) United States Patent
Asano et al.

(10) Patent No.: US 6,867,115 B2
(45) Date of Patent: Mar. 15, 2005

(54) COMPOUND SEMICONDUCTOR DEVICE

(75) Inventors: Tetsuro Asano, Ora-Gun (JP);
Toshikazu Hirai, Ora-Gun (JP);
Takayoshi Higashino, Neyagawa (JP);
Koichi Hirata, Ashikaga (JP); Mikito Sakakibara, Oosato-Gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 227 days.

(21) Appl. No.: 10/211,311

(22) Filed: Aug. 5, 2002

(65) Prior Publication Data

US 2002/0195617 A1 Dec. 26, 2002

Related U.S. Application Data

(60) Division of application No. 09/973,197, filed on Oct. 10, 2001, now Pat. No. 6,508,107, which is a continuation-in-part of application No. 09/855,036, filed on May 15, 2001, now abandoned.

(30) Foreign Application Priority Data

| Oct. 10, 2000 | (JP) | ................................ 2000-308617 |
| Jan. 31, 2001 | (JP) | ................................ 2001-023680 |
| Jun. 18, 2001 | (JP) | ................................ 2001-182686 |
| Jun. 18, 2001 | (JP) | ................................ 2001-182687 |

(51) Int. Cl.$^7$ ............................................. H01L 21/265
(52) U.S. Cl. ........................................................ 438/523
(58) Field of Search .................... 438/46, 174, 216, 438/272, 285, 514, 518, 523, 533, 572, 483; 257/187, 217, 249, 279, 506, 737, 738, 784

(56) References Cited

U.S. PATENT DOCUMENTS

| 5,324,969 | A | * | 6/1994 | Murai et al. ................. 257/279 |
| 5,508,210 | A | * | 4/1996 | Terazono .................... 438/403 |
| 5,548,239 | A |   | 8/1996 | Kohama |
| 5,552,335 | A | * | 9/1996 | Mahon et al. ................. 438/50 |
| 5,861,656 | A | * | 1/1999 | Keri ............................ 257/491 |
| 5,949,140 | A | * | 9/1999 | Nishi et al. .................. 257/728 |
| 6,153,488 | A | * | 11/2000 | Yoshino ....................... 438/345 |
| 6,329,677 | B1 | * | 12/2001 | Oguri et al. .................. 257/194 |
| 6,683,380 | B2 | * | 1/2004 | Efland et al. ................ 257/734 |

FOREIGN PATENT DOCUMENTS

| JP | 6-29811 | 2/1994 |
| JP | 6-334506 | 12/1994 |
| JP | 7-303001 | 11/1995 |

(List continued on next page.)

OTHER PUBLICATIONS

*CompactGaAs ICs For PHS*, Kaoru Nogawa et al. Sanyo Technical Review vol. 29, No.1 Apr. 1997. pp52–59.

(List continued on next page.)

Primary Examiner—Carl Whitehead, Jr.
Assistant Examiner—Jennifer M. Dolan
(74) Attorney, Agent, or Firm—Morrison & Foerster LLP

(57) ABSTRACT

The conventional compound semiconductor switching device is prone to have a large chip size as the gate width needs to be large for achieving a low insertion loss and the separation between the connecting pad and the circuit wiring needs to be larger than 20 μm for obtaining a proper isolation between them. The overall chip size is reduced, first, by reducing the gate width of the switching FET operating at frequencies above 2.4 GHz to 700 μm or smaller together with the omission of the shunt FET, and, then, by reducing the separation between the connecting pad and the circuit wiring to 20 μm or smaller. This reduction of the separation is made possible by the introduction of an insulating film and a impurity region between the outermost portion of the connecting pad and the substrate for preventing the extension of the depletion layer. The manufacturing method of this device does not need any additional processing step for accommodating the above structure, and is capable of producing a device having a size of one fifth of the conventional device.

9 Claims, 17 Drawing Sheets

FOREIGN PATENT DOCUMENTS

| | | |
|---|---|---|
| JP | 8-70245 | 3/1996 |
| JP | 8-195667 | 7/1996 |
| JP | 8-204528 | 8/1996 |
| JP | 8-204530 | 8/1996 |
| JP | 8-213891 | 8/1996 |
| JP | 2-557561 | 9/1996 |
| JP | 8-293776 | 11/1996 |
| JP | 9-55682 | 2/1997 |
| JP | 63-20041 | 4/1998 |

OTHER PUBLICATIONS

*High Power DPDT Antenna Switch MMIC For Digital Cellular Systems*, Kazumasa Kohama et al. IEEE Journal of Solid–State Circuits, vol. 31, No. 10, Oct. 1996.

*High Power Handling GaAs SWIC For GSM Application*, Noriyuki Ohbata et al. NEC Kansai Ltd. vol. 52 No. Mar. 1999. pp150–152.

* cited by examiner

PRIOR ART

PRIOR ART

PRIOR ART

COMPOUND SEMICONDUCTOR DEVICE

REFERENCE TO RELATED APPLICATION

This application is a division of Ser. No. 09/973,197, filed Oct. 10, 2001, now U.S. Pat. No. 6,508,107 which is a continuation-in-part of Ser. No. 09/855,036, filed May 15, 2001, now abandoned, the entire disclosure of which is incorporated by reference as if fully set forth herein.

BACKGROUND OF THE INVENTION

1. Field of the Invention

This invention relates to a compound semiconductor device operating at high frequencies, especially to a compound semiconductor device operating at a frequency of about 2.4 GHz or higher and to a method for manufacturing such a device.

2. Discussion of the Related Art

Mobile communication devices such as mobile telephones often utilize microwaves in the GHz range and commonly need a switching device for switching high frequency signals, which is used in a switching circuit for changing antennas and in a switching circuit for transmitting and receiving the signals. A typical example of such a switching device can be found in Japanese Laid-Open Patent Publication No. Hei 9-181642. Such a device often uses a field-effect transistor (called FET hereinafter) made on a gallium arsenide (GaAs) substrate as the material is suitable for being used under high frequency, and developments have been made in forming a monolithic microwave integrated circuit (MMIC) by integrating aforementioned switching circuits.

FIG. 19A is a cross-sectional view of a conventional GaAs FET. The GaAs substrate 1 is without doping, and has, beneath its surface, an n-type channel region (or a channel layer) 2 formed by doping n-type dopants. A gate electrode 3 is placed on the surface of the channel region 2, forming a Schottky contact, and two signal electrodes, namely a source 4 and drain electrode 5, are placed on both sides of the gate electrode 3 forming ohmic contacts to the surface of the channel region 2. In this transistor configuration, a voltage applied to the gate electrode 3 creates a depletion layer within the channel region 2 beneath the gate electrode 3 and thus controls the channel current between the source electrode 4 and the drain electrode 5.

FIG. 19B shows a basic circuit configuration of a conventional compound semiconductor switching device, called SPDT (Single Pole Double Throw), using GaAs FETs. One of the two signal electrodes, which can be either a source electrode or a drain electrode, of each FET (FET1 denoting the first FET and FET2 denoting the second FET) is connected to a common electrode IN. Another of the two signal electrodes of each FET (FET1 and FET2) is connected to an output terminal (OUT1 and OUT2). The gate of FET1 and that of FET2 are connected to the control terminals Ctl-1 and Ctl-2 through resistors R1 and R2, respectively. A complementary signal is applied to the first and second control terminals, Ctl-1 and Ctl-2. When a high level signal is applied to the control terminal of an FET, the FET changes to an on-state and forms a signal pass from the common input terminal IN to the output terminal of the FET. The role of the resistors R1 and R2 is to prevent the leaking of the high frequency signals through the gate electrodes to the DC voltage applied on the control terminals (Ctl-1 and Ctl-2).

An equivalent circuit of the aforementioned conventional compound semiconductor switching device is shown in FIG. 20. In the microwave technology, the standard characteristic impedance is 50Ω, and, thus, in this case the characteristic impedance of each terminal is 50Ω (R1=R2=R3=50Ω). With the voltages of the three terminals being represented by V1, V2, and V3, respectively, the insertion loss and the isolation are given by the following equations I and II:

Insertion Loss=20 log($V2/V1$)[dB]  [I]

Isolation=20 log($V3/V1$)[dB]  [II]

Equation I is the insertion loss expressed in dB when a signal is transmitted from the common input terminal IN to the output terminal OUT1, and equation II expresses the isolation between the common input terminal IN and the output terminal OUT2, also in dB.

In this type of compound semiconductor switching device, it is required that the insertion loss be minimal while improving the isolation when one designs an FET which is inserted in series into the pass. The reason a GaAs FET is used as the FET in this type of device is that GaAs has a higher electron mobility than silicon and thus a lower electric resistance, making it easier to attain a low insertion loss, and that a GaAs substrate is a semi-insulating material suitable for attaining high isolation between the signal passes. On the other hand, GaAs substrates are more expensive than silicon substrates, and such devices cannot compete with silicon devices once a comparable device, such as a PIN diode, is made from silicon substrates.

FIG. 21 shows a circuit of a compound semiconductor switching device which has been used in commercial products. In this configuration, shunt FET3 and shunt FET4 are introduced between the output terminals OUT1, OUT2 of the switching FETs and the ground, such that the complementary signals from the control terminals Ctl-1 and Ctl-2 are applied on the gates of shunt FET3 and shunt FET4, respectively. As a result, when FET1 is at an on-state, shunt FET4 is also at an on-state, while FET2 and shunt EFT3 are at an off-state.

In this configuration, when the signal between the common input terminal IN and the output terminal OUT1 is switched on, and accordingly the signal between the common input terminal IN and the output terminal OUT2 is switched off, the input signal leaking to the output terminal OUT2 is directed to ground through a capacitor C connected to ground. Thus, it is possible to improve the isolation over the configuration without the shunt FETs.

The conventional design guidelines for compound semiconductor switching devices seek to increase the gate width for reducing the on-state resistance, thereby reducing the insertion loss. Increasing gate width, then, leads to an increase in the size of FET1 and FET2, resulting in a larger overall chip size.

Furthermore, many compound semiconductor switching devices utilize semi-insulating substrates such as GaAs substrates, and the wiring for electronic circuit and the connecting pads for bonding the bonding wires under heat and pressure are directly formed on the substrates. Since high frequency signals in the GHz range are applied to the device, it is required that there be a certain separation between the neighboring circuit wiring portions for assuring proper isolation between them. The isolation required for compound semiconductor switching device is 20 dB or higher, and it has been experimentally proved that a separation of 20 μm or more is required to assure this level of isolation. The connecting pads, which usually occupy a significant portion of the substrate surface, also need, as an element of the device circuit, this separation from the most neighboring circuit wiring, thus further contributing to the trend of increasing overall chip size.

In summary, the conventional design guidelines for compound semiconductor switching devices seek to increase the gate width in order to reduce the on-state resistance, thereby reducing the insertion loss. The large width of the gate electrode, however, leads to increased capacitance of the gate electrode, resulting in reduced isolation. Thus, it is inevitable that a shunt FET has to be introduced into the circuit for directing the leaking input signal to ground for improving isolation.

Thus, the conventional compound semiconductor switching device has an extremely large chip size, with the typical size being 1.07×0.50 mm. This is against the current semiconductor design trend, in which cost reduction is sought by reducing the chip size. As a result, expensive compound semiconductor devices for switching have been replaced by inexpensive silicon-based counterparts and have lost their share of the market.

SUMMARY OF THE INVENTION

Therefore, this invention is directed to compound semiconductor devices, including but not limited to switching devices, particularly for use at frequencies of about 2.4 GHz and higher, which have a significantly smaller chip size than conventional devices while maintaining low insertion loss and high isolation.

This invention provides a compound semiconductor circuit device having a substrate made of a compound semiconductor, a connecting pad which is formed directly on the substrate and a impurity region which is formed underneath the connecting pad and prevents a depletion layer from expanding beyond the high dopant region. The impurity region may also be formed underneath wiring layers on the substrate. Such an impurity region prevents extension of the depletion region, and thus high frequency signal losses between the connecting pads, between the connecting pad and the wiring layer, and between portions of the wiring layer, even when the separation is less than 20 $\mu$m.

The invention also provides a compound semiconductor circuit device having a first and second FET, a common input terminal connected to signal electrodes of the FETs, a first and second output terminal connected to the signal electrode of the first and second FET, first and second control terminal connected to the gate electrodes of the first FET and second FET, and a impurity region which is formed underneath connecting pads for the terminals. Again, the impurity region prevents extension of the depletion region, and thus high frequency signal losses between the connecting pads, between the connecting pad and the wiring layer, and between portions of the wiring layer, even when the separation is less than 20 $\mu$m.

In the devices according to the invention, the gate width, Wg, of each of the first and second FET's is no more than 700 $\mu$m and the gate length, Lg, is no more than about 0.5 $\mu$m.

The invention further includes a method for manufacturing such compound semiconductor devices comprising the steps of depositing an insulating cover, preferably a silicon nitride film, on a substrate; forming on the substrate a source and a drain region adjacent to a channel region, further forming an impurity region underneath of a connecting pad and/or a wiring layer; forming a source and a drain electrode; removing the insulating cover from the impurity region; forming a gate electrode and forming the connection pad and/or the wiring layer; and attaching a bonding wire to the connection pad. The silicon nitride film deposited on top of the substrate serves as a general insulating cover. Since the impurity region underneath the connection pad and the wiring layer ensure sufficient isolation without additional insulation cover, the silicon nitride film can according to the invention be removed from the impurity region before the bonding wire is attached to the connection pad. By virtue of this any risk of a breakage of the silicon nitride film underneath the connecting is eliminated. This leads to simpler and more cost effective manufacturing as well as to a higher yield rate of the inventive compound semiconductor device.

BRIEF DESCRIPTION OF THE DRAWINGS

This invention may be better understood, and its features and advantages become apparent to those skilled in the art, by referring to the accompanying drawings.

DETAILED DESCRIPTION OF THE INVENTION

The first embodiment of this invention will be described hereinafter in reference to FIG. 1 through FIG. 8.

Figure 1:
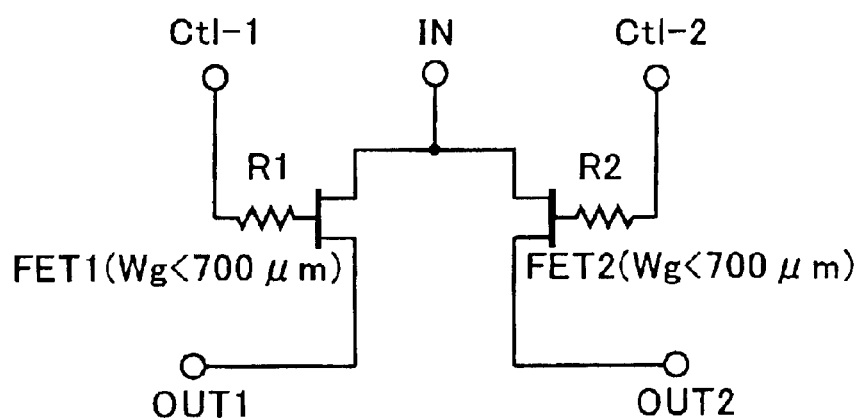
FIG. 1 is a circuit diagram of a first embodiment of this invention.

FIG. 1 is a circuit diagram for describing the compound semiconductor device of this invention. One of the two signal electrodes, which can be either a source electrode or a drain electrode, of each FET (FET1 denoting the first FET and FET2 denoting the second FET) is connected to a common electrode IN. Another of the two signal electrodes of each FET (FET1 and FET2) is connected to an output terminal (OUT1 and OUT2). The gate of FET1 and that of FET2 are connected to the control terminals Ctl-1 and Ctl-2 through resistors R1 and R2, respectively. A complementary signal is applied to the first and second control terminals Ctl-1 and Ctl-2. When a high level signal is applied to the control terminal of an FET of the two FETs, the FET changes to an on-state and forms a signal pass from the common input terminal IN to the output terminal of the FET (OUT1 or OUT2). The role of the resistors R1 and R2 is to prevent the leaking of the high frequency signals through the gate electrodes to the DC voltage applied on the control terminals (Ctl-1 and Ctl-2).

Figure 19A:
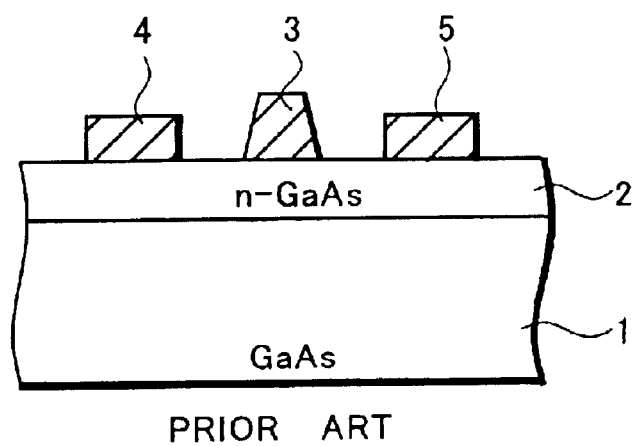
FIG. 19A shows a cross-sectional view and FIG. 19B shows a circuit diagram of a conventional compound semiconductor switching device.
Figure 19B:
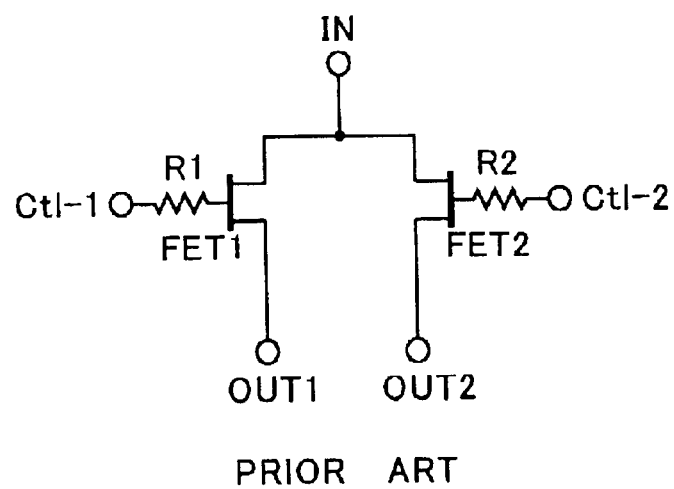
Figure 20:
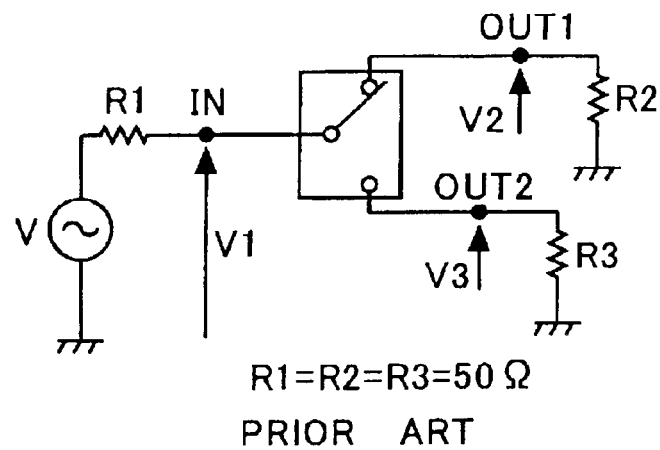
FIG. 20 is an equivalent circuit diagram of a conventional compound semiconductor switching device.
Figure 21:
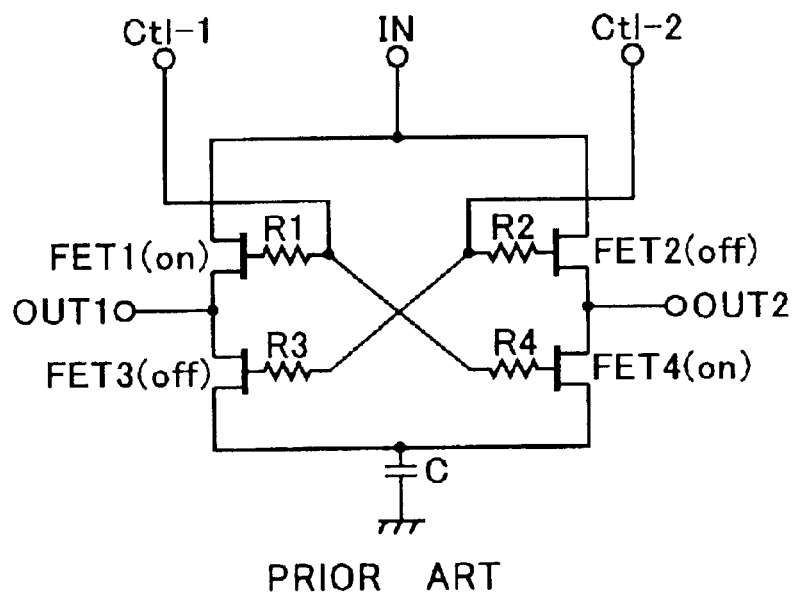
FIG. 21 is a circuit diagram of a conventional compound semiconductor switching device.

In principle, the circuit shown in FIG. 1 is similar to the basic circuit configuration of the conventional compound semiconductor switching device using GaAs FETs, shown in FIG. 19B, called SPDT (Signal Pole Double Throw). One significant difference is that the gate width, Wg, of each of FET1 and FET2 of this invention is designed to be equal to or less than about 700 $\mu$m. In reducing the gate width, Wg, in comparison to the gate width of the conventional device, the on-state resistance becomes larger, and the parasitic capacitance generated by the Schottky contact between the gate electrode and the channel region becomes smaller as the surface area of the gate electrode (Lg×Wg) becomes smaller. This is a significant difference in the operation of the circuitry between the invention and the conventional compound semiconductor switching device.

Figure 2:
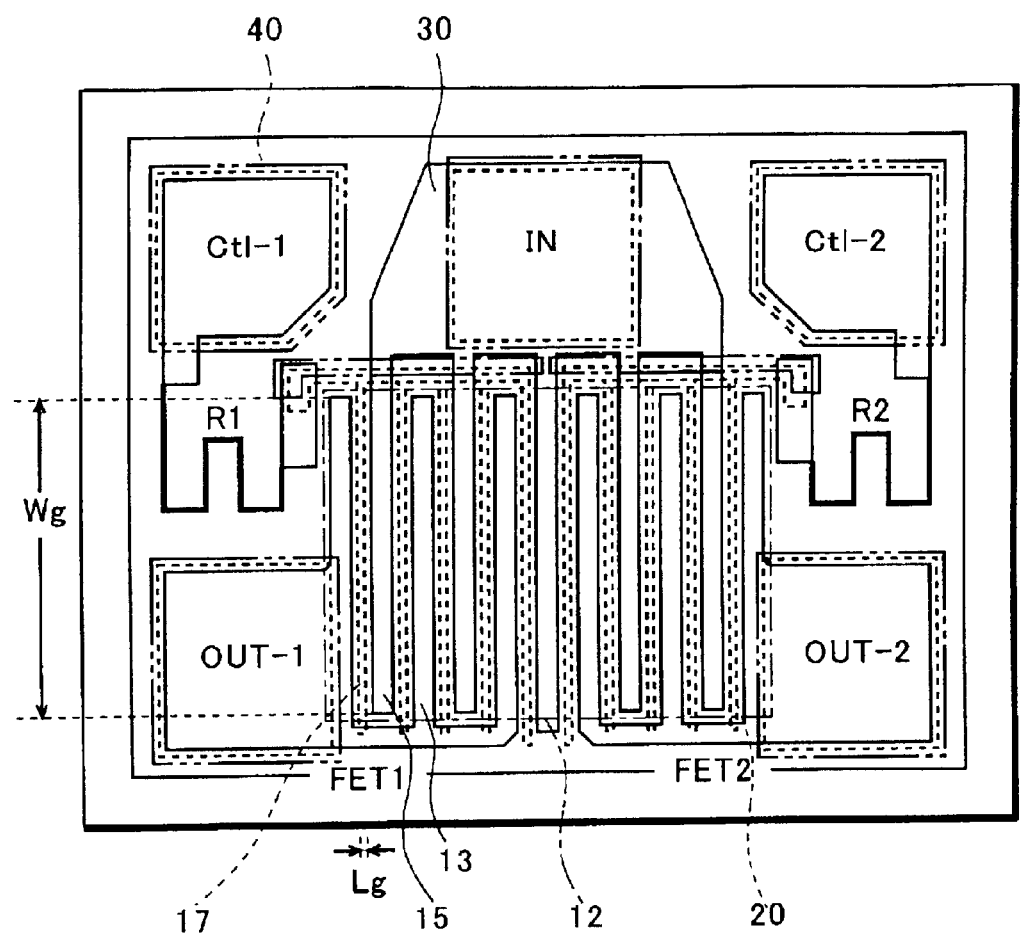
FIG. 2 is a plan view of a compound semiconductor device of the first embodiment of this invention.
Figure 3:
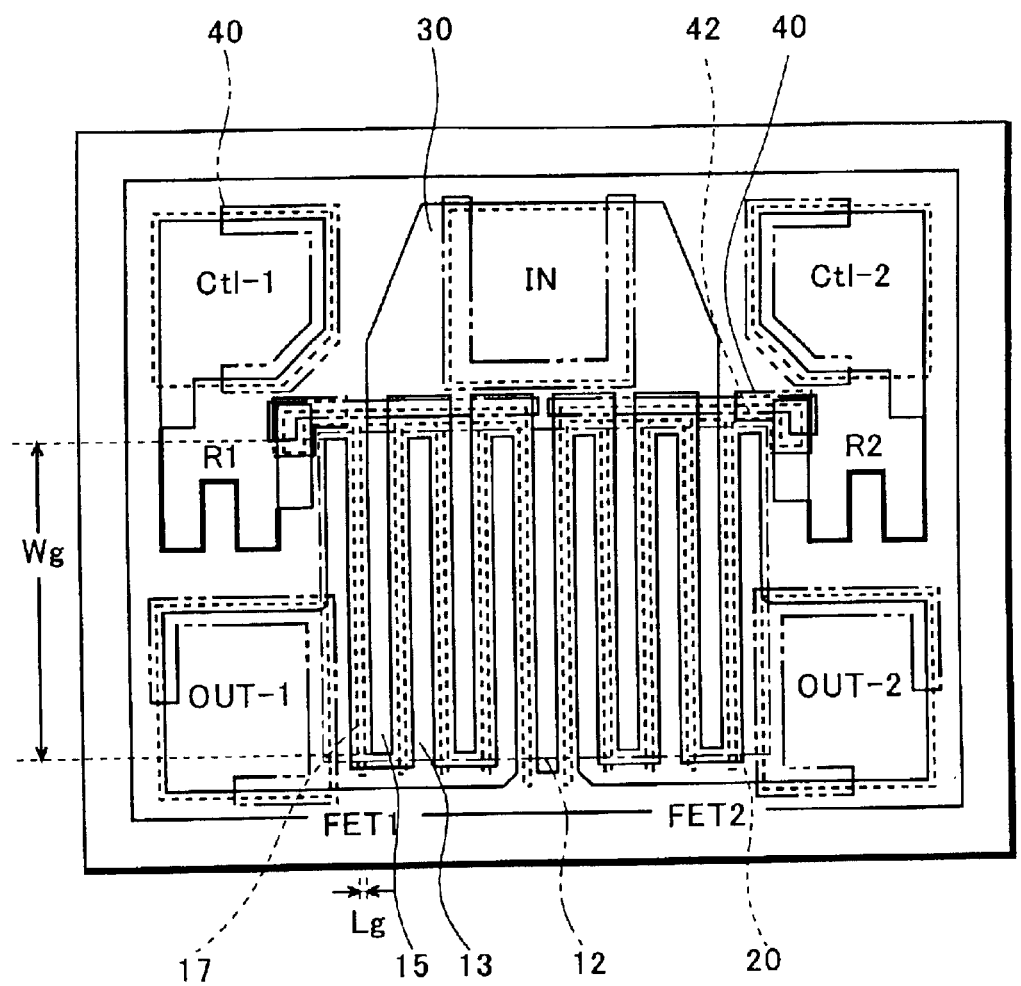
FIG. 3 is a plan view of a compound semiconductor device of a second embodiment of this invention.

FIGS. 2 and 3 show two compound semiconductor chips in which the compound semiconductor switching device of this invention is embodied as an integrated circuit. The two device differ only in the shape and placement of the activated impurity region 40 (denoted by the unevenly broken line), which is formed underneath the connecting pad. The device of FIG. 2 has the activated impurity region 40 in the area covered by the connecting pad, while the device of FIG. 3 has the region 40 only at the peripheral portion of the connecting pad. In both cases, the expansion of the depletion layer is prevented by the activated impurity region 40. The activated impurity region 40 has a well grown crystal structure and is electrically conductive. It is typically made of an impurity diffusion region formed by ion injection or a conductive epitaxial layer. Either an n type or a p type layer may be used, and the impurity concentration should be at least higher than 1×10 16 cm$^{-3}$ for preventing the expansion of the depletion layer. This activated impurity layer is called the impurity layer hereinafter.

FET1 and FET2 for the switching operation are formed in the middle of a GaAs substrate with the gate electrode of each FET being connected to its respective resistor (R1 or R2). Of importance for purposes of this invention, the term "gate width" of an FET is defined as being the summation of the of overlapping electrode lengths of the comb-like gate electrodes of the FET. Connecting pads are formed in the peripheral area as the common input terminal IN, the output terminals OUT1, OUT2, and the control terminals Ctl-1, Ctl-2. The dashed lines indicate a second wiring layer which is formed in the same processing step as the gate electrodes of the FET and consists of a gate metal layer (Ti/Pt/Au) 20. A third wiring layer indicated by the solid lines is for connecting the device elements and forming the connecting pads, and consists of a pad metal layer (Ti/Pt/Au) 30. The first wiring layer contains an ohmic metal layer (AuGe/Ni/Au) making an ohmic contact to the substrate, which forms the source electrode, the drain electrode, and the connecting electrodes at both edges of each resistor. In FIG. 2, the first layer is not shown as it overlaps with the pad metal layer.

It is seen from FIG. 2 that the components of the device are FET1, FET2, the resistors R1, R2, and the connecting pads including the common input terminal IN, the output terminals OUT1, OUT2, and the control terminals Ctl-1, Ctl-2. It is apparent that the number of the device elements is minimal in comparison to that of conventional compound semiconductor switching device, such as the one shown in FIG. 22.

One significant feature of this first embodiment is that the size of the FET, either FET1 or FET2, is smaller than the size of the switching FET of the conventional device by more than 50%, since the gate width of each of the FET's is equal to or less than about 700 $\mu$m, which is smaller than the gate width of the conventional device by more than 50%. FET1 is formed in the left half of the channel region 12 defined by the rectangle encircled by the dashed line. Three third layer source electrodes 13, which have a comb-like structure and extend from the bottom portion, are made of the pad metal layer 30 as the third metal layer, and connected to the output terminal OUT1. In this configuration, the source electrodes 13 are interchangeable with the drain electrodes as one of the signal electrodes of the FET. Beneath these third layer source electrodes 13 are formed first layer source electrodes 14 (also interchangeable with the drain electrodes) which are made of the same ohmic metal as the first metal layer. Furthermore, three third layer drain electrodes 15, which have a comb-like structure and extend from the top portion, are also made of the pad metal layer 30 in the third layer, and connected to the common input terminal IN. Again, the drain electrodes 15 are interchangeable with the source electrodes as one of the signal electrodes of the FET. Beneath these third layer drain electrodes 15 are formed first layer drain electrodes 16 (also interchangeable with the source electrodes) which are made of the same ohmic metal as the first metal layer. The two sets of the signal electrodes are juxtaposed interlocking each other, and five gate electrodes 17, which are made of the same gate metal as the second metal layer 20, are formed between the teeth of the combs in the channel region 12, creating another comb-like structure. Furthermore, the drain electrode 15 of the middle tooth of the upper comb is shared by FET1 and FET2, further contributing to the size reduction of the device. Again, in this configuration, the gate width of an FET is defined as being the summation of the lengths of each of the teeth of the gate electrode comb (length of one tooth multiplied by number of the teeth).

Figure 4:
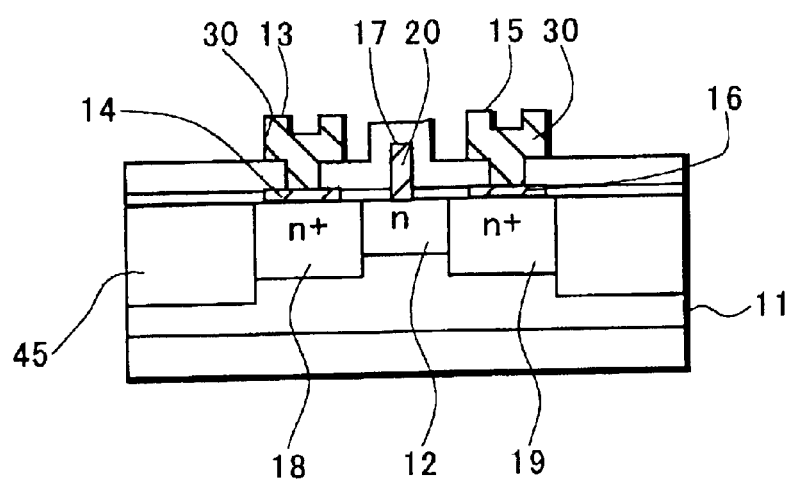
FIG. 4 is a cross-sectional view of an FET used in various embodiments of this invention.

FIG. 4 shows a cross-sectional view of a FET cut perpendicular to the teeth of the comb. The GaAs substrate 11 has an epitaxially grown n-type channel region 12, and two heavily doped regions at both ends of the channel region 12, namely, a source region 18 and a drain region 19. The epitaxial layer 12 is formed on a buffer layer. The gate electrode 17, which is made of the same gate metal as the second metal layer, is formed on the surface of the channel region 12. The first layer drain electrode 14 and the first layer source electrode 16, which are made of the same ohmic metal as the first metal layer, are formed on the surface of the heavily doped regions. These two types of electrodes collectively operate as signal electrodes. On top of the first layer signal electrodes are formed the third layer signal electrodes made of the same pad metal as the third metal layer 30, namely the third layer drain electrode 13 and the third layer source electrode 15. Reference numeral 45 denotes a pseudo-insulating region. This layer is responsible for wiring the device elements of the chip.

Now, explanation will be given of how proper isolation and proper insertion loss are achieved at the signal frequencies above about 2.4 GHz in the compound semiconductor switching device, which are not provided with shunt FETs.

Figure 5:
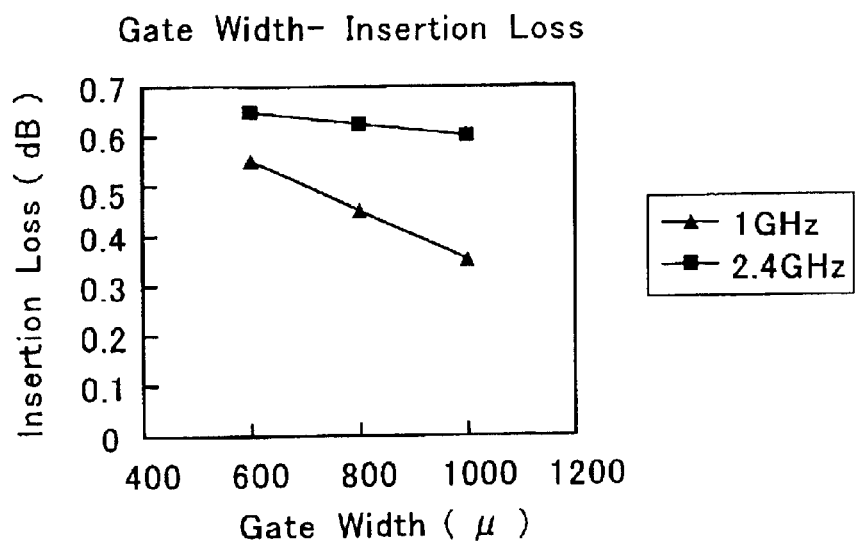
FIG. 5 is a graph of the insertion loss as a function of the gate width in one embodiment of this invention.

FIG. 5 shows the insertion loss as a function of the gate width, Wg, of the FET when the gate length, Lg, is about 0.5 $\mu$m.

When the signal frequency was 1 GHz, the insertion loss increased from 0.35 dB to 0.55 dB by 0.2 dB as the gate width, Wg, is reduced from 1000 $\mu$m to 600 $\mu$m. However, at a signal frequency of 2.4 GHz, the insertion loss increased only by 0.05 dB from 0.60 dB to 0.65 dB for the same reduction of gate width, Wg, from 1000 $\mu$m to 600 $\mu$m. This was because the effect of the on-state resistance of the FET on the insertion loss was significant at a signal frequency of 1 GHz, but the same effect was much less significant at a signal frequency of 2.4 GHz.

One theory we have considered to account for the aforementioned effect of the signal frequency on the insertion loss, by which we do not intend to be bound in this description, is that the capacitance generated at the gate of the FET becomes more pronounced and eventually surpasses the on-state resistance of the FET as the major contributing factor to the insertion loss with the increase in the frequency from 1.0 to 2.4 GHz. As a result, we have concluded that the capacitance, which gives rise to the reduction of the isolation, rather than the on-resistance, should be considered first in establishing low insertion loss when the signal frequency is above about 2.4 GHz. This guideline is the opposite of the conventional design guideline for the compound semiconductor switching device.

Figure 6:
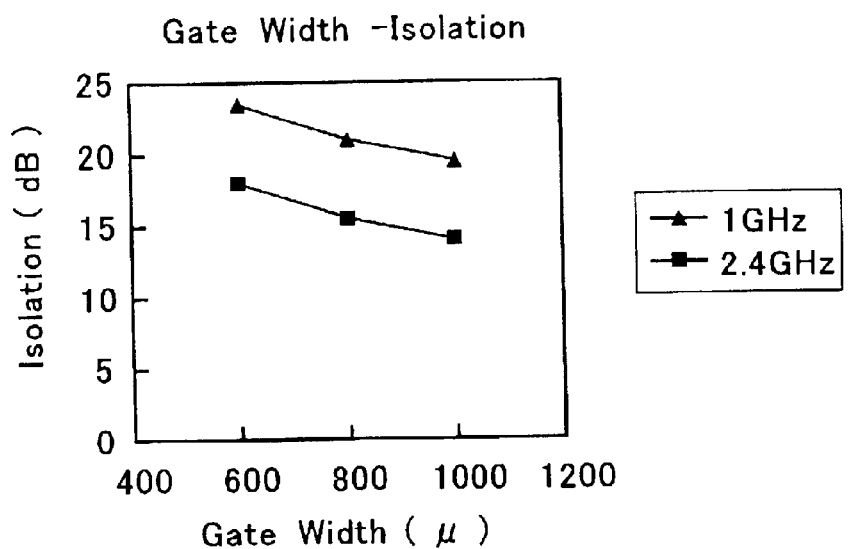
FIG. 6 is a graph of the isolation as a function of the gate width in one embodiment of this invention.

FIG. 6 shows the isolation as a function of the gate width, Wg, of the FET when the gate length, Lg, is about 0.5 $\mu$m.

When the signal frequency was 1 GHz, the isolation increased from 19.5 dB to 23.5 dB by 4.0 dB as the gate width, Wg, decreased from 1000 $\mu$m to 600 $\mu$m. Similarly, at the signal frequency of 2.4 GHz, the isolation also increased from 14 dB to 18 dB by 4 dB for the same decrease in of the gate width, Wg, from 1000 $\mu$m to 600 $\mu$m. This was because the isolation improved with the reduction of the capacitance of the gate electrode.

From the discussion above, it is apparent that the chip size of the compound semiconductor device can be reduced by assuring high isolation first, which is essentially making the gate width, Wg, smaller as shown in FIG. 6, since the insertion loss does not change much, as shown in FIG. 5, depending on the gate width, Wg, at a signal frequency equal to or higher than about 2.4 GHz. It is possible to achieve isolation equal to or higher than 16.5 dB at a signal frequency of 2.4 GHz, when the gate width, Wg, was equal to or less than 700 $\mu$m. The isolation was equal to or higher than 18 dB when the gate width, Wg, was equal to or less than 600 $\mu$m at the same signal frequency.

In the compound semiconductor device of this embodiment shown in FIG. 2, FET 1 and FET 2 each had a gate length of 0.5 $\mu$m and a gate width, Wg, of 600 $\mu$m, and an insertion loss of 0.65 dB and an isolation of 18 dB were achieved. The characteristic of this device is suitable for a communication-switching device in the application of the spectrum-spread communication technology which utilizes 2.4 GHz range ISM Band (Industrial, Scientific, and Medial frequency Band) including Bluetooth (a specification for improving the amenity of mobile terminals and business-use computers by connecting mobile telephones, laptop computers, hand-held information terminals, digital cameras, and their peripherals using wireless communication means).

The new design guidelines described above lead to the size reduction of the switching FETs and the omission of the shunt, both of which contribute to the overall size reduction of the compound semiconductor switching device. However, the reduction of the separation between the connecting pad and the circuit wiring is another major contributing factor to the overall size reduction of the device and will be described hereinafter.

Figure 7A:
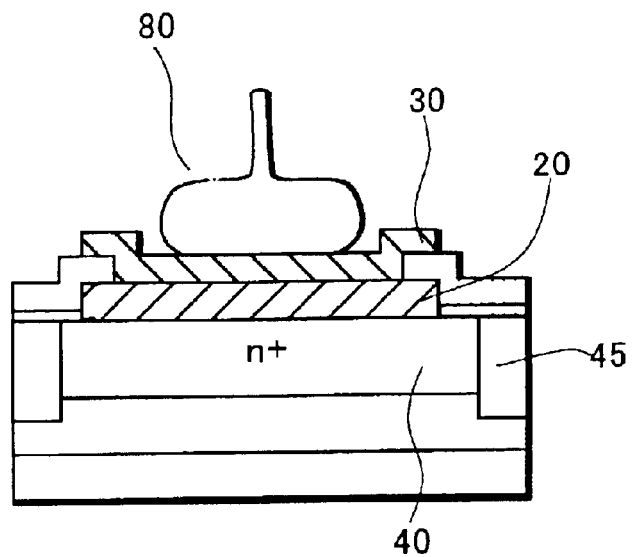
FIG. 7A shows a cross-sectional view of a connecting pad in the compound semiconductor device of the first embodiment of this invention.
Figure 7B:
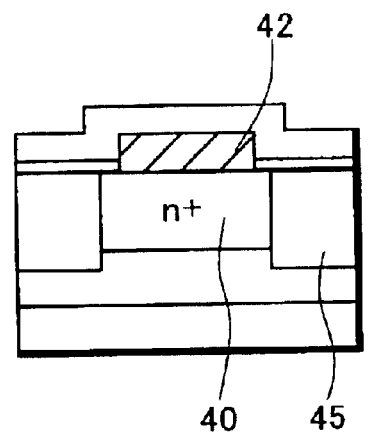
FIG. 7B shows a cross-sectional view of its wiring.

The structure of the connecting pad and the wiring of the compound semiconductor switching device of this embodiment is shown in FIGS. 2 and 3, and FIGS. 7A and 7B. FIG. 7A shows a cross-section of the device at the connecting pad, and FIG. 7B at the wiring. As shown in FIGS. 2 and 3, five connecting pads, namely, the common input terminal IN, the output terminals OUT1, OUT2, and the control terminals Ctl-1, Ctl-2, are disposed on the peripheral area of the substrate. The connecting pad includes an impurity region 40, which is formed in the substrate 11 underneath all the pad area, as shown by the dashed lines in FIG. 2, or along the outermost portion of the pad, as shown in FIG. 3. The pad also includes the gate metal layer 20, the major portion of which is directly in contact with the substrate 11, and the pad metal layer 30, which is formed over the gate metal layer 20. A gold bonding wire 41 is bonded to the pad metal layer 30 of the connecting pad by ball bonding. Reference numeral 45 denotes a pseudo-insulating region. When a semi-insulating substrate of $1\times10^7$ $\Omega$ is used, ion doping of $^{29}$Si with a concentration of $1–5\times10^{18}$ cm$^{-3}$ prevents the extension of the depletion layer such that the separation among the pads and the wiring is made as small as 4 $\mu$m with an isolation as high as 20 dB. This may be achieved by forming the impurity region under the pads, forming the impurity region under the wiring, or forming the impurity region under both the pads and the wiring. Furthermore, this invention is not limited to a switching device, and is applicable to any other compound semiconductor device.

In the first embodiment shown in FIG. 2, the impurity region 40 is formed on the substrate 11 underneath all the pad area. Therefore, unlike the substrate 11 with no impurity doped (although it is semi-insulating, the resistance value of the substrate is $1\times10^7$ $\Omega$cm), the impurity concentration of the substrate of this embodiment is high (the type of ion is $^{29}Si^+$, and the concentration is $1-5\times10^{18}$ $cm^{-3}$), and the depletion layer around the pad area does not expand. Thus, the distance between the pad and the neighboring wiring layer can be reduced to 41 μm, which still ensures the 20 dB isolation. Because of this impurity region 40, it is also possible to place the pads and the wiring close to other components of the device including FETs, even though those other components do not have the impurity region 40 underneath themselves.

Also in the second embodiment seen from FIG. 3, the pad of the common input terminal IN has the impurity region 40 along all its sides except the topside. The pad of each of the output terminals OUT1, OUT 2 has the impurity region 40 along all its four sides except the portion located at the corner of the GaAs substrate. The pad of each of the control terminals Ctl-1, Ctl-2 has the impurity region 40 along its four sides of the irregular pentagon except the portion located at the corner of the GaAs substrate and the portion used for the connection to the resistors R1, R2. Each outermost portion of the connecting pads, which is not provided with the impurity region 40, is located near the edge of the GaAs substrate and is free from isolation caused by the potential leakage due to the extension of the depletion layer since there is enough separation from the neighboring connecting pads and circuit wiring.

The five connecting pads usually occupy almost half the whole area of the semiconductor chip. Therefore, the pad structure of this invention can contribute to the size reduction of the semiconductor chip, since it allows the placement of the wiring layer closer to the pads.

As a result, in this embodiment of the invention, it is possible to reduce the chip size of the compound semiconductor switching device to mere 0.37×0.30 mm. This chip size is only about 20% of the chip size of the conventional compound semiconductor device.

Other improvements have been made in the circuit characteristics of the compound semiconductor switching device of this embodiment. The first is that a VSWR (Voltage Standing-Wave Ratio) of 1.1 to 1.2 was achieved. VSWR is a measure of the reflection of the high frequency input power from the switching portion of a device. Specifically, VSWR is the ratio between the maximum and the minimum of a voltage standing wave which is generated by an incoming wave and a reflected wave at a discontinuous portion of a transmission line of high frequency signal. In an ideal condition without any reflection, VSWR is equal to 1. The VSWR value obtained with the device of this embodiment is a significant improvement over the conventional compound semiconductor switching device with the shunt FETs, the VSWR value of which is about 1.4. This was achieved as the compound semiconductor switching device of this embodiment has only two switching FETs along the transmission line of high frequency signal, making the circuit configuration simpler. The smaller size of the FETs also contributed to reduction of the reflection.

Figure 8:
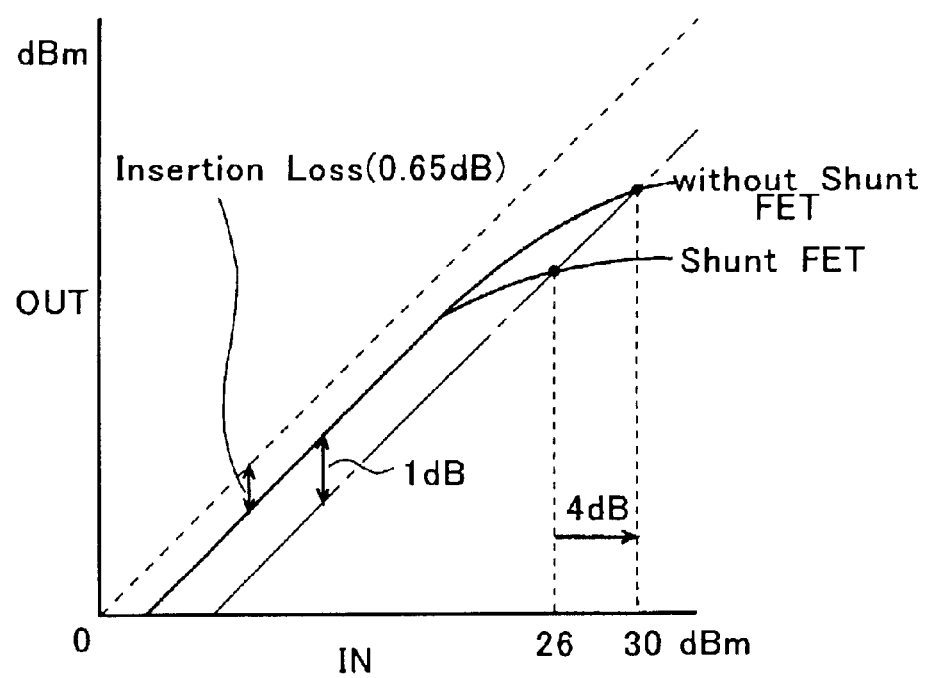
FIG. 8 is a characteristic diagram depicting the deviation from linearity between the input and output power in one embodiment of this invention.

The second improvement is that $P_{IN}1$ dB of devices in accordance with this invention is 30 dBm. $P_{IN}1$ dB is a measure of the linearity between the input high frequency signal and the output signal, which is shown in FIG. 8. In the ideal case, the ratio between input and output power is 1. However, in actual cases, the output power decreases due to the inevitable insertion loss. Since the output power deviates from linearity with the increase of the input power, $P_{IN}1$ dB is defined as the point where the output power is smaller than the input power by a summed amount of the insertion loss in the linearity region and 1 dB. While $P_{IN}1$ dB is 26 dB for the conventional compound semiconductor switching device with shunt FETs, the value is 30 dB for the compound semiconductor switching device without shunt FETs of this embodiment. The difference of 4 dB is significant, because, in the conventional device with shunt FETs, the linearity suffers from both pinch-off voltages of the switching FET and the shunt FET in the off-state while, in the device of this embodiment without shunt FETs, only the switching FET in the off-state affects the linearity.

For the sake of comparison to the conventional compound semiconductor switching device, a configuration of the device based on the conventional art will be described below in reference to FIG. 22.

FET1 and FET2 for switching operation are formed in the middle of a GaAs substrate with FET1 being placed on the left and FET2 being placed on the right. Also in this configuration, the gate width of an FET is defined as being the summation of the length of each of the teeth of the gate electrode comb. Shunt FET3 and shunt FET4 are formed in the lower left and right corners of the substrate, respectively. Resistors R1, R2, R3 and R4 are connected to the gate electrodes of the respective FETs. Also formed on the peripheral area of the substrate are a common input terminal IN, output terminals OUT1, OUT2, control terminals Ctl-1, Ctl-2, and a ground terminal GND. Further, the source electrodes of shunt FET3 and shunt FET4 form a unitary part, and are connected to the ground terminal GND through a capacitor C for grounding. The wiring denoted by the broken lines is in the second metal layer, and made of a gate metal layer (Ti/Pt/Au), which is formed simultaneously with the gate electrodes of the FETs. The wiring denoted by the solid lines is in the third metal layer, and made of a pad metal layer (Ti/Pt/Au), which connects the device elements together and forms the connecting pads. In the first metal layer, an ohmic metal layer (AuGe/Ni/Au), which forms an ohmic contact to the substrate, is formed as the source electrodes, the drain electrodes, and the connecting electrodes at both ends of the resistors. As this ohmic metal layer overlaps with the pad metal layer, it is not shown in FIG. 22. In this configuration, the gate width, Wg, of the FET1 and the FET2 was 1400 μm, and that of the shunt FET3 and FET4 was 400 μm. The gate length, Lg, was very close to 0.5 μm so that the on-state resistance of the FET was minimal.

Figure 22:
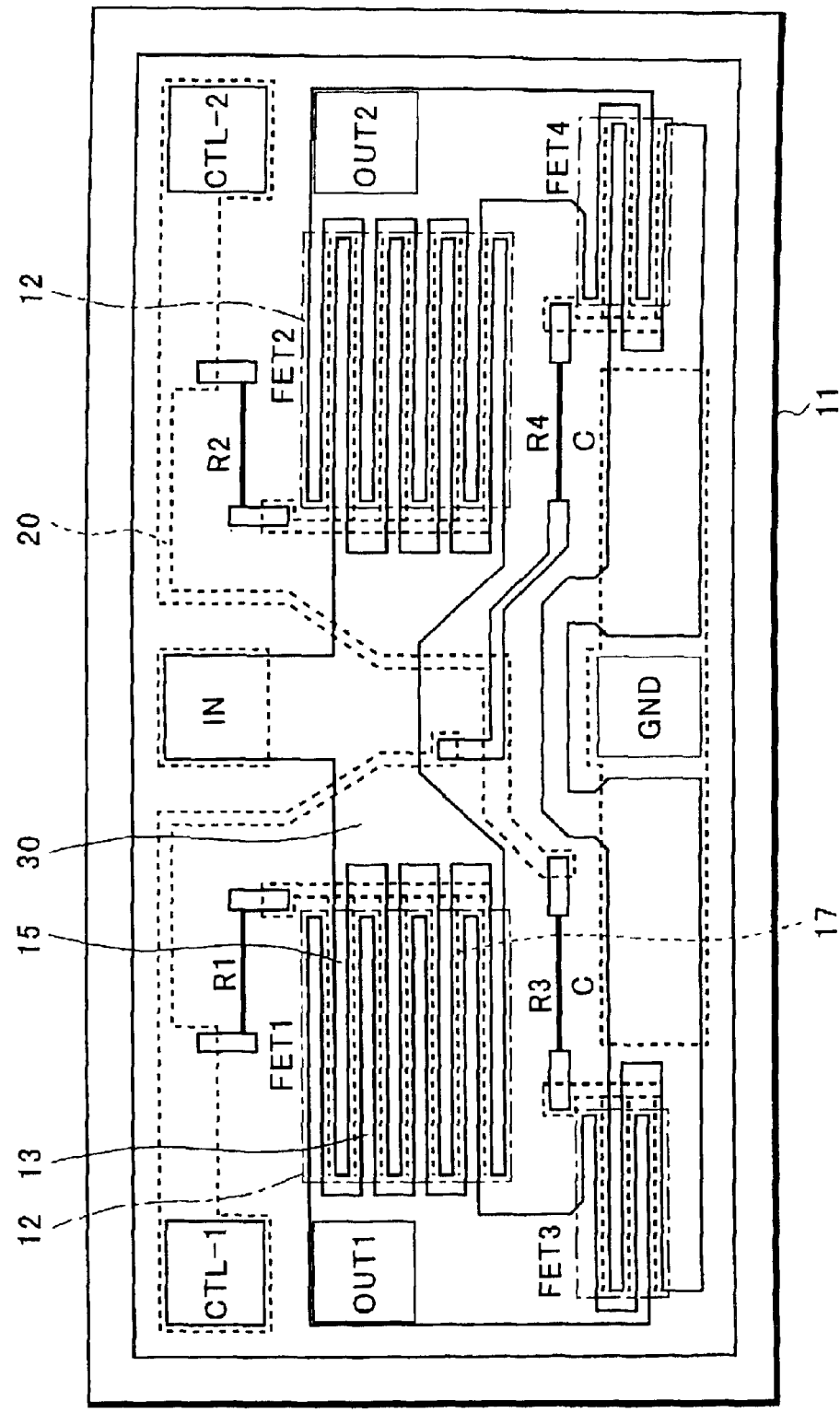
FIG. 22 is a plan view showing a conventional compound semiconductor switching device in comparison to that in FIG. 2.

A simple comparison between FIGS. 2 and 3 and FIG. 22 shows that the compound semiconductor switching device of this invention is much smaller than the conventional device. One of the measures to compare the sizes is that the gate width of the FET of the device of this invention is smaller than one half of the gate width of the switching FET of the conventional device. The comparison also shows that the number of the device elements is smaller than that of the conventional device. In addition to these contributing factors to the reduction of the overall chip size, it is also a significant contribution of this invention that the separation between the connecting pad and the circuit wiring can be made smaller than 20 μm along the sides of the common input terminal IN, the output terminals, OUT1, OUT2, and the control terminals Ctl-1, Ctl-2.

Now, the manufacturing method of the compound semiconductor switching device of this invention will be described hereinafter in reference to FIG. 9 through FIG. 18.

Figure 9A:
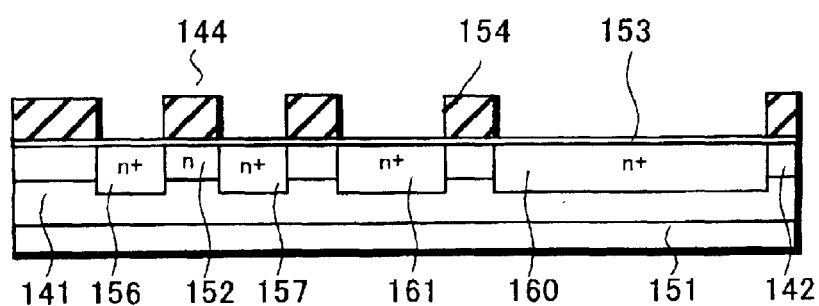
FIGS. 9A and 9B are cross-sectional views of a device intermediate according to a manufacturing method for making the device of this invention.
Figure 9B:
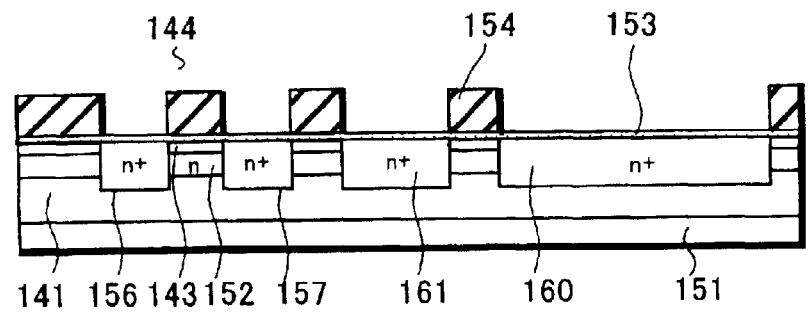

As shown in FIGS. 9A and 9B, the first stage of the manufacturing method of this invention is to sequentially deposit the buffer layer 141 and the epitaxial layer 142 of the first conduction type on the non-doped GaAs substrate 151.

Then, the channel region 144 of the FET is formed through the formation of the source and drain regions 156, 157 adjacent to the channel region 152 comprising the epitaxial layer 142 of the first conduction type. Also, the impurity regions 160, 161 are simultaneously formed in the predetermined locations for the pad region and the wiring layer.

This stage is the first important feature of this invention. That is, as shown in FIG. 9A, the buffer layer 141 of about 6000 Å thickness for preventing the leakage is formed on the non-doped compound semiconductor substrate 151 made of such a material as GaAs. Here, the buffer layer is either a non-doped layer or an epitaxial layer with a doped impurity. N-type epitaxial layer 142 ($2\times10^{17}$ $cm^{-3}$ concentration, 1100 Å) is developed on this layer. Then, the whole surface is covered with the silicon nitride film 153 for through-ion implantation with a thickness of 100–200 Å.

The resist layer 154 is formed on the entire surface. Then photolithography processing is selectively performed on the resist layer 154 to create openings at the predetermined areas for the source region 156 and the drain regions 157, and at the predetermined areas for the wiring layer 162 and the pad region 170. Next, using the resist layer 154 as a mask, ion implantation of the impurity ($^{29}Si^+$), which provides an n-type property, is performed in the predetermined areas for the source region 156 and the drain regions 157, and to the n-type epitaxial layer 42 under the predetermined areas for the wiring layer 162 and the pad region 170. As a result, the $n^+$-type source region 156 and the drain region 157 are formed and simultaneously the impurity regions 160, 161 are formed on the epitaxial layer 142 in the predetermined area for the wiring layer 162 and the pad region 170.

The source region 156 and the drain region 157 are formed adjacent to the channel layer 152 comprising the n-type epitaxial layer 142. Although a pair of the source and drain regions 156 and 157, and the channel layer 152 are shown in FIG. 9, a plurality of the channel regions 144 of the FET are formed between the common source region 156 and the common drain region 157.

N-type epitaxial layer 142 is more desirable as the channel layer 152 than such channel layer of the FET formed by the ion implantation.

That is, when the channel layer is formed by the ion implantation, the profile of the impurity concentration of the channel layer has a peak in the middle. However, when the n-type epitaxial layer is developed, the concentration in the channel layer is uniform. For example, under the same pinch-off voltage and the same gate width, the Idess, or maximum saturated drain current, increases more in the FET with channel layer comprising the n-type epitaxial layer. Also, under the same Idess and the same gate width, the pinch-off voltage can be smaller in the FET with the channel layer comprising the n-type epitaxial layer. In the FET used in the switching circuit, the FET of the signal sender side (on-side) will have a larger maximum linear input power with a larger the Idess. And the FET of the signal receiver side (off-side) will withstand greater power the smaller the pinch-off voltage.

That is, as the FET for the switching circuit, the maximum linear input power can be increased when the channel layer comprising the n-type epitaxial layer is formed compared to the case when the channel layer is formed by ion implantation.

Additionally, under the same pinch-off voltage and the same Idess, the parasitic capacity can be reduced since the gate width can be made narrower. Thus, the leakage of the high frequency signal can be prevented, which also leads to the improved isolation.

The resist layer 154 is removed such that a portion of the impurity regions 160, 161 is deposited outside of the predetermined areas for the pad electrode 170 and the wiring layer 162. As a result, under the areas for the pad electrode 170 and the wiring layer 162, which are formed in the later steps of the manufacturing process, the impurity regions 160, 161 are formed, such that a portion of the high concentration regions is deposited outside of these predetermined areas.

Since the surface of the substrate is covered with the n-type epitaxial layer, it is necessary to separate the channel region 144 from the other regions. Thus, on the surface of the substrate other than the portion for the channel region 144, the pseudo-insulating layer 145 is formed in later in the process. However, since this pseudo-insulating region 145 is the epitaxial layer, where impurity such as boron ion is implanted to the n-type epitaxial layer, it is not an electrically complete insulating layer, and its strength against the voltage is finite. That is, if the pad electrode or the wiring layer is formed directly on this layer without following this invention, the depletion layer would extend to the adjacent electrode or wiring layer due to the high frequency signal, leading to the potential leakage of the high frequency signal.

However, the if $n^+$-type impurity regions 160, 161 are formed on the GaAs substrate under the pad electrode 170 and the wiring layer 162, the impurity concentration will be high (the type of ion is $^{29}Si^+$, the concentration is $1-5\times10^{18}$ $cm^{-3}$). This separates the wiring layer 162 and the pad electrode 170 from the pseudo-insulating region 145. Also, since the depletion layer does not extend to the pseudo-insulating region 145, the distance between the pad electrode 170 and the wiring layer 162 adjacent to each other can be greatly reduced.

In practice, a 4 μm separation is enough to ensure the isolation of 20 dB or more. Also, it is known from the electromagnetic field simulation, that the 4 μm separation can ensure the isolation of about 40 dB at 2.4 GHz.

That is, sufficient isolation is ensured by forming the impurity regions 160, 161 in such a way that a portion of the impurity regions 160, 161 is deposited outside of the areas for the pad electrode 170 and the wiring layer 162. Thus, the nitride film, which has been employed for reliability purpose, can be now eliminated.

Since there is no need to provide the nitride film, the probable breakage of the nitride film upon the pressure sealing of the bonding wire will be avoided. Thus, gold plating, which has been coupled with use of the nitride film, is no longer required. Gold plating is an expensive procedure that requires a number of processes. Thus, the elimination of the gold plating process can greatly contribute to the simplification of the manufacturing process as well as to the cost reduction.

Furthermore, the 4 μm separation between the pad electrode 170 and the wiring layer 162 is enough to ensure the isolation of 20 dB. In the compound semiconductor device, where, for example, five connecting pads occupy half of the whole area of the semiconductor chip, this invention allows great reduction of the chip size leading also to the cost reduction of the compound semiconductor device.

As seen from FIG. 9B, the non-doped epitaxial layer 143 of 1000 Å thickness can also be deposited on the n-type epitaxial layer, which becomes the channel layer 152 of the FET. As it will be explained later, when the gate electrode is buried during the gate electrode formation process, it is possible to form the gate electrode with limited parasitic capacity by burying the gate electrode down to the area near the lower portion of the non-doped epitaxial layer 143. Here, the non-doped epitaxial layer 143 can be either GaAs or InGaP.

Figure 10:
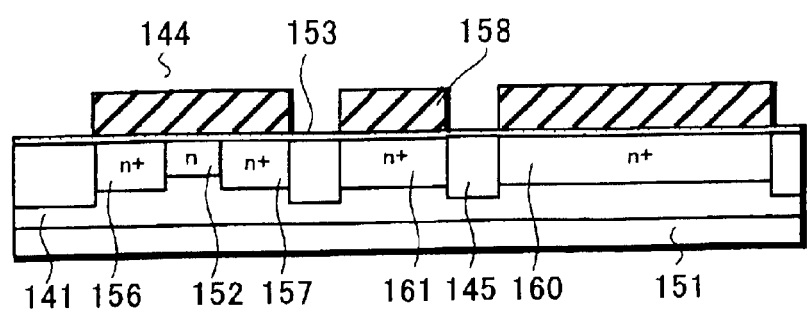
FIG. 10 is a cross-sectional view of a device intermediate according to a manufacturing method for making the device of this invention.

The second stage of the manufacturing method of this invention is, as seen from FIG. 10, to form the pseudo-insulating region 145 on the whole surface except the areas for the channel region 144 and the impurity regions 160, 161.

As described above, since the channel region 144 and the impurity regions 160, 161 are formed by the selective formation of the $n^+$-type impurity region on the n-type epitaxial layer 142, it is necessary to separate them. That is, the resist layer 158 is newly formed on the whole surface and the photolithography processing is selectively performed on the resist layer 158 to create openings at the channel region 144 of the FET and the impurity regions 160, 161 under the wiring layer and the pad electrode. Then, using the resist layer 158 as a mask, the ion implantation of the impurity (B+ or H+) with a dose of $1\times10^{13}$ cm$^{-2}$ and an acceleration voltage of 100 KeV is performed on the GaAs substrate. After the resist layer is removed, the anneal for activation is performed. This activates the source and drain regions 156, 157 and the impurity regions 160, 161. Then, the pseudo-insulating region 145, which separates the channel region 144 and the impurity regions 160, 161, is formed. As explained above, this pseudo-insulating region 145 is not an electrically complete insulating layer, but an epitaxial layer with impurity ions implanted.

Figure 11:
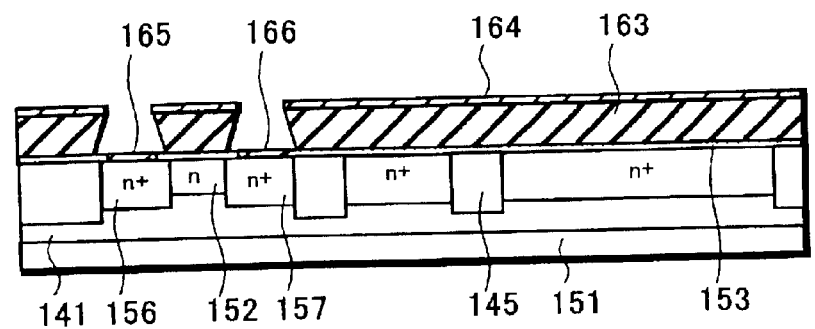
FIG. 11 is a cross-sectional view of a device intermediate according to a manufacturing method for making the device of this invention.

The third stage of the manufacturing method of this invention, as shown in FIG. 11, is to form the first source electrode 165 and the first drain electrode 166 by attaching ohmic metal layer 164, as an electrode, to the source region 156 and the drain region 157 respectively.

First, photolithography processing is performed to create openings selectively on the predetermined areas for the first source electrode 165 and the first drain electrode 166. The silicon nitride film 153 on the predetermined areas for the first source electrode 165 and the first drain electrode 166 is removed by CF$_4$ plasma. Then, three layers of AuGe, Ni, and Au, which comprise the ohmic metal layer 164, are sequentially deposited by the vacuum evaporation. Next, the resist metal layer 163 is removed. The first source electrode 165 and the first drain electrode 166, which make contacts with the source region 156 and the drain region 157 respectively, is formed by a lift-off process. Then, the ohmic contact between the first source electrode 165 and the source region 156, and the ohmic contact between the first drain electrode 166 and the drain region 157 are formed by alloy heating treatment.

Figure 12:
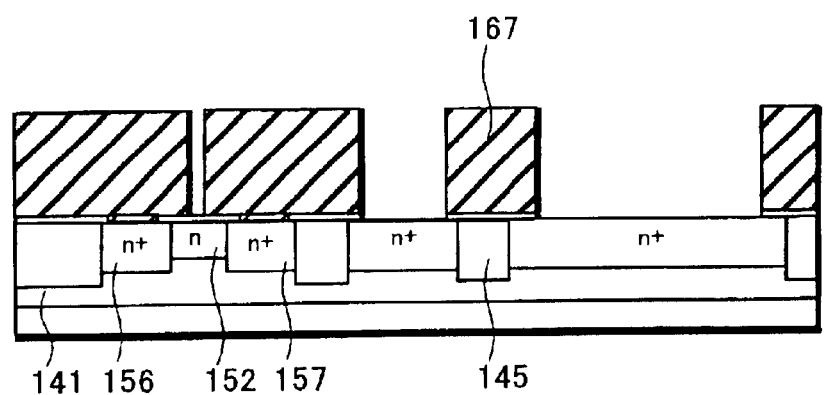
FIG. 12 is a cross-sectional view of a device intermediate according to a manufacturing method for making the device of this invention.
Figure 13:
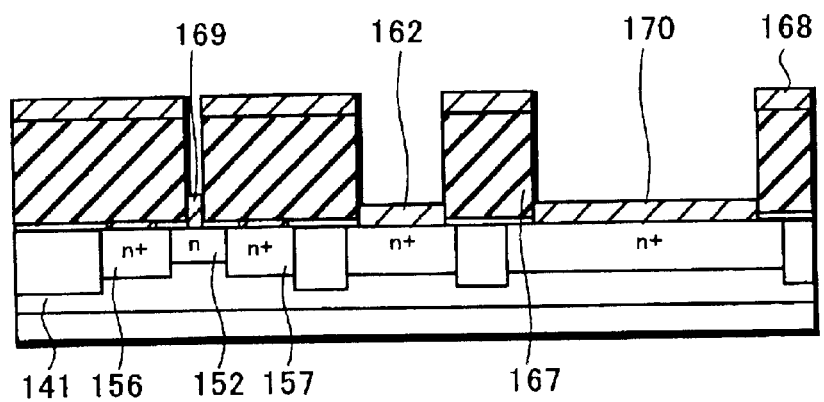
FIG. 13 is a cross-sectional view of a device intermediate according to a manufacturing method for making the device of this invention.

The fourth stage of the manufacturing method of this invention, as shown in FIGS. 12–14, is to form the gate electrode 169, the first pad electrode 170, and the wiring layer 162 by attaching the gate metal layer 168, as the second layer of electrode, to the channel layer 152 and the impurity regions 160, 161.

This stage is another characteristic feature of this invention. As shown in FIG. 12, as the first embodiment, the photolithography processing is performed selectively to create openings at the predetermined areas for the gate electrode 169, the pad electrode 170, and the wiring layer 162. The dry etching is performed on the silicon nitride film 153 exposed at the predetermined areas for the gate electrode 169, the pad electrode 170, and the wiring layer 162 to expose the channel layer 152 corresponding to the predetermined area for the gate electrode 169 and to expose the GaAs corresponding to the predetermined areas for the pad electrode 170 and the wiring layer 162.

The opening at the predetermined area for the gate electrode 169 should be 0.5 μm, so that the miniaturization of the gate electrode 169 is possible. As explained in the description of the first stage, the nitride film, which has been needed for ensuring the isolation, can now be omitted, since the impurity regions 160, 161 are provided.

As shown in FIG. 13, the gate electrode 169 and the wiring layer 162 and the first pad electrode 170 are formed by attaching the gate metal layer 168, as the second layer of electrode, to the exposed channel layer 152 and the exposed portion of the GaAs.

That is, three layers of Ti, Pt, and Au, which comprise the gate metal layer 168 as the second layer of electrode, are sequentially deposited on the GaAs by vacuum evaporation. Then the resist layer 167 is removed. And the gate electrode 169 with a gate length of 0.5 μm, which makes contact with the channel layer 152, the first pad electrode 170, and the wiring layer 162 are formed by a lift-off process.

Figure 14A:
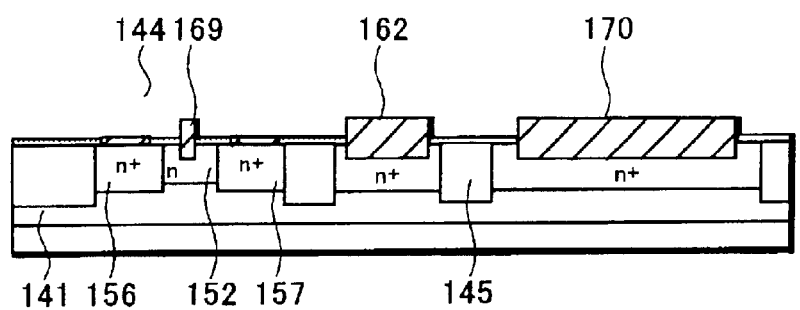
FIGS. 14A and 14B are cross-sectional views of a device intermediate according to a manufacturing method for making the device of this invention.

Also, as in the second embodiment of the manufacturing method, as shown in FIG. 14, it is possible to bury a portion of the gate electrode 169 in the channel layer 152. In this case, four layers of Pt, Ti, Pt, and Au, as the gate metal layer, are sequentially deposited by vacuum evaporation. Then the gate electrode 169, the first pad electrode 170, and the wiring layer 162 are formed by the lift-off. Then the heat processing for burying Pt is performed. As a result, as seen from FIG. 14A, a portion of the gate electrode 169 is buried into the channel layer 152 maintaining the Schottky contact with the GaAs. Considering the fact that the gate electrode 169 is buried in the channel layer 152, the depth of the channel layer 152 should be made deeper to produce the desirable FET characteristics, when n-type epitaxial layer 142 is deposited during the first process of the manufacturing.

The surface of the channel layer 152 (about 500–1000 Å from the surface) does not function as a channel because of the facts that the natural depletion layer develops and that the crystallization is not uniform in this region. By burying a portion of the gate electrode 169 into the channel layer 152, the area where electric current goes through directly under the gate electrode 169 is deeper from the surface of the channel layer 152. Since the channel layer 152 is formed thick enough to accommodate the buried portion of the gate electrode 169 in order to produce the desirable FET characteristics, the channel layer 152 can be effectively utilized as a channel. In fact, it improves the current density, the channel resistance, and the high frequency signal distortion characteristics.

Figure 14B:
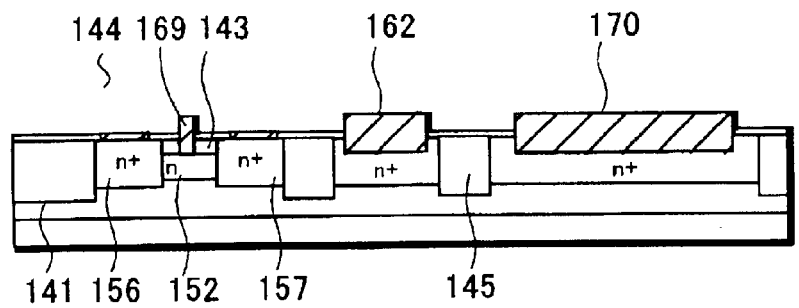

As explained in the description of the first stage, and as seen from FIG. 14B, it is also possible to deposit the non-doped epitaxial layer 143 made of GaAs or InGaAs on the n-type epitaxial layer 142. The portion, which functions as an FET, is the part where the gate electrode 169 touches the channel layer 152. Thus, when the gate electrode 169 is buried, the parasitic capacitance at the side walls of the gate electrode 169 increases. Therefore, by forming the non-doped epitaxial layer 143 and burying the gate electrode 169 down to the lower edge of that layer, the parasitic capacitance in the side walls of the gate electrode 169 can be suppressed, resulting in the improved effect of the buried gate electrode 169.

In either case, since the nitride film under the pad electrode 170 and the wiring layer 162 can be removed, there is no occurrence of breakage of the nitride film. The nitride film has been needed to prevent electric static break down and to ensure isolation. However, since the impurity regions 160, 161 are formed under the pad electrode 170 and the wiring layer 162, it is now possible to suppress the expansion of the depletion layer and to ensure the certain isolation without nitride film.

Therefore, the gold plating process can be omitted, since this process is required to prevent the breakage of the nitride film. Thus, cost reduction as well as the simplification of the manufacturing process can be achieved.

Figure 15:
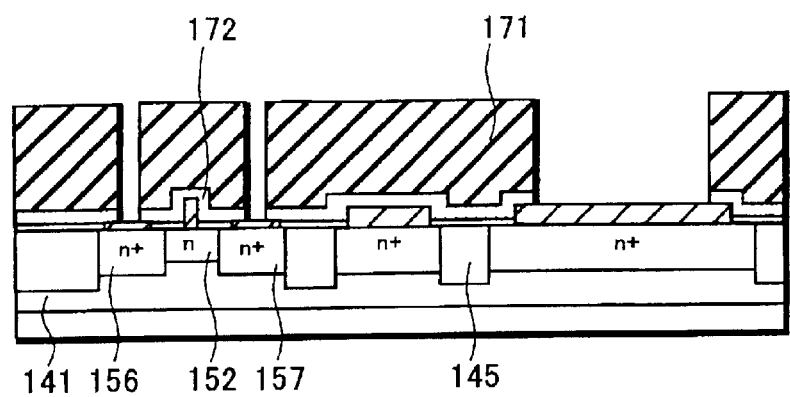
FIG. 15 is a cross-sectional view of a device intermediate according to a manufacturing method for making the device of this invention.
Figure 16:
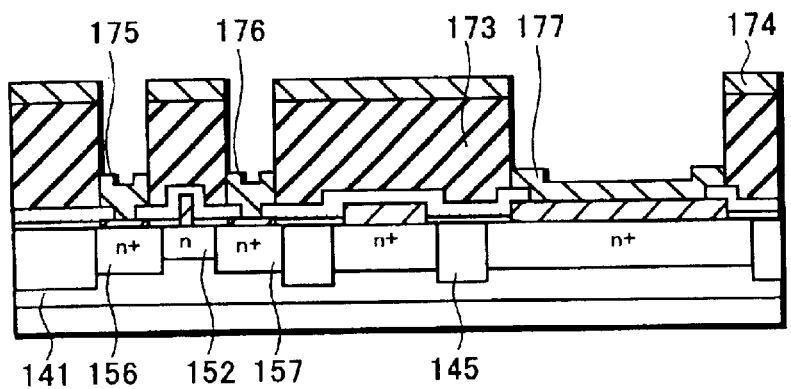
FIG. 16 is a cross-sectional view of a device intermediate according to a manufacturing method for making the device of this invention.

The fifth stage of the manufacturing process of this invention, as shown in FIGS. 15 and 16, is to form the second source and drain electrodes 175, 176, and the second pad electrode 177, by attaching the pad metal layer 174, as the third layer of electrode, to the first source and drain electrodes 165, 166, and the first pad layer 170 respectively.

In FIG. 15, the contact holes are formed on the passivation film 172 at the location of the first source electrode 165, the first drain electrode 166, and the first pad electrode 170. After the formation of the gate electrode 169, the wiring layer 162 and the first pad electrode 170, the substrate 151 is covered with the passivation film 172 comprising silicon nitride film in order to protect the channel layer 152 around the gate electrode 169. Photolithography processing is performed on the passivation film. The openings in the resist are selectively created at the contact areas with the first source electrode 165, the first drain electrode 166, and the first pad electrode 170. Then, dry etching is performed on the portions of the passivation film 172 located at those openings. Then the resist layer 171 is removed.

In FIG. 16, the second source electrode 175, the second drain electrode 176, and the second pad electrode 177 are formed by attaching the pad metal layer 174 as the third layer of electrode to the first source electrode 165, the first drain electrode 166, and the first pad electrode 170 respectively.

On the substrate 151, the resist layer 173 is newly applied. Photolithography processing is performed on the resist to selectively create openings at the predetermined areas for the second source electrode 175, the second drain electrode 176, and the second pad electrode 177. Then, three layers of Ti, Pt, and Au, which becomes the pad metal layer 174 as the third layer of electrode, are sequentially deposited by vacuum evaporation, forming the second source electrode 175, the second drain electrode 176, and the second pad electrode 177, which make contact with the first source electrode 165, the first drain electrode 166, and the first pad electrode 170 respectively. The other portion of the pad metal layer 174 is attached to the resist layer 173. Thus, it is removed when the resist layer 173 is removed when the second source electrode 175, the second drain electrode 176, and the second pad electrode 177 are formed by the lift-off. However, the portion of the pad metal layer 174, which is utilized for forming the wiring portion, remains.

Figure 17A:
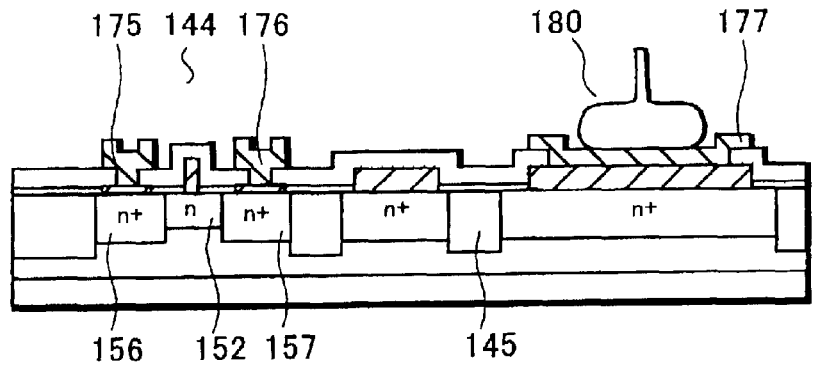
FIGS. 17A, 17B and 17C are cross-sectional views of a device intermediate according to a manufacturing method for making the device of this invention.
Figure 17B:
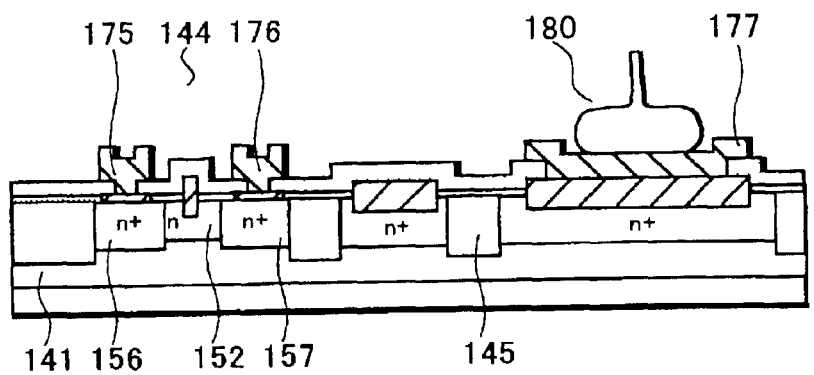
Figure 17C:
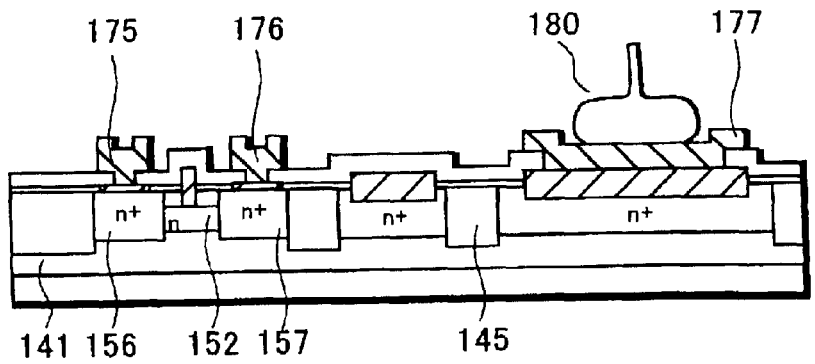

The sixth stage of the manufacturing method of this invention, as seen from FIG. 17, is to attach the bonding wire 180 to the second pad electrode 177 by pressure sealing. FIG. 17A shows the first embodiment and FIGS. 17B and 17C show the second embodiment of this invention.

In this stage, as mentioned earlier, the crack upon the pressure sealing of the bonding wire can be prevented, since the nitride film under the impurity regions 160, 161, the first pad electrode 170 and the second pad electrode 177 can be eliminated.

Upon the completion of the aforementioned stage, the compound semiconductor device is now sent to the latter processes for assembly. The wafer having chips are diced and separated into individual chips. After fixing the semiconductor chip on the frame (not shown in figures), the second pad electrode 177 of the semiconductor chip and the predetermined lead (not shown in figures) are connected with the bonding wire 180. The gold thin wire is used as the bonding wire 180, and connection is made by the conventional ball bonding. Then, the chip is resin packaged using transfer molding.

Figure 18A:
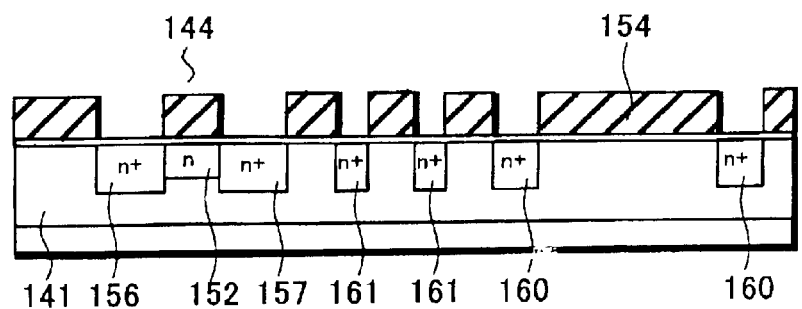
FIG. 18A shows a cross-sectional view of a device intermediate, FIG. 18B a cross-sectional view of the device, and FIG. 18C a partial top view of the device corresponding to the features shown in the cross-sectional views of the device.
Figure 18B:
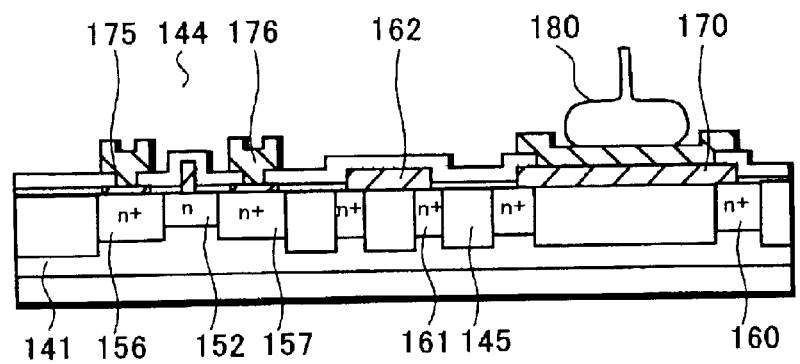

Also, as shown in FIGS. 18A and 18B, by performing photolithography processing to create openings selectively in the resist layer, it is possible to form the impurity regions such that a portion of impurity regions is deposited outside the predetermined areas for the wiring layer 162 and the pad electrode 170. In this case, the pseudo-insulating region 145 is located directly under the pad electrode 170 and the wiring layer 162. However, the leakage of the high frequency signal applied to the pad to the wiring layer 162 through the pseudo-insulating region 145 is prevented because of the impurity regions 160, 161.

Figure 18C:
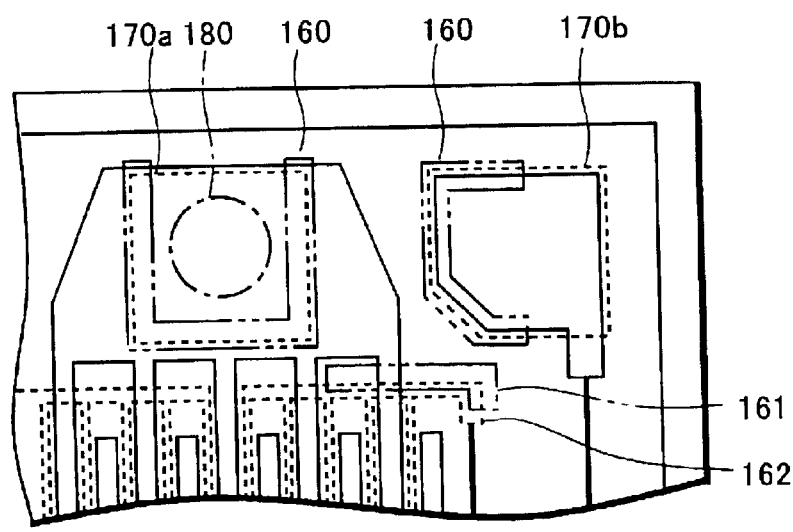

FIG. 18C shows an example of the allocation of the impurity regions 160, 161. The impurity regions 160, 161 can be formed to surround the pad electrode 170 and the wiring layer 162. It is also possible to allocate the impurity regions as shown in FIG. 18C. That is, the impurity region 160 is formed around the pad electrode 170a along all its sides except the top side, and the impurity region 160 is formed around the pad electrode 170b along its four sides of the irregular pentagon except the portion located at the corner of the GaAs substrate. The areas, which are not provided with the impurity region 160, are all located near the edge of the GaAs substrate and free from the problems caused by the potential leakage due to the extension of the depletion layer since there is enough separation from the neighboring connecting pads and circuit wiring.

Also the impurity region 161 is selectively formed under the wiring layer 162 at the side adjacent to the pad electrodes 170a, 170b.

The above configuration is just an example. Other configurations are possible as long as they can prevent the leakage of the high frequency signal applied to the pad electrode 170 to the wiring layer 162 through the pseudo-insulating region 145. It is also possible to bury the gate electrode 169 in the channel layer 152, such as in the second embodiment of this invention.

While the invention has been described and illustrated with respect to specific embodiments, it will be understood by those skilled in the art that various changes and modifications may be made without departing from the spirit and scope of the invention. All such modifications are intended for inclusion within the scope of the following claims.

What is claimed is:

1. A method of manufacturing a compound semiconductor device, comprising:

depositing an insulating cover comprising a silicon nitride film on a substrate;

forming on the substrate a source region and a drain region adjacent to a channel region and forming an impurity region underneath an area of the substrate on which a connecting pad or a wiring layer is to be formed;

forming a source electrode and a drain electrode;

removing the insulating cover to expose the impurity region;

forming a gate electrode;

forming the connection pad or the wiring layer on the exposed impurity region; and attaching a bonding wire to the connection pad.

2. The method of manufacturing a compound semiconductor device of claim 1, further comprising depositing a buffer layer on the substrate having a thickness from 4000 to 8000 Å.

3. The method of manufacturing a compound semiconductor device of claim 2, wherein the buffer layer is deposited as an epitaxial layer and is doped with an impurity.

4. The method of manufacturing a compound semiconductor of claim 2 or 3, further comprising depositing a non-doped epitaxial layer having a thickness from 700 to 1300 Å.

5. The method of manufacturing a compound semiconductor device of claim 4, further comprising burying the gate electrode in the epitaxial layer.

6. The method of manufacturing a compound semiconductor device of claim 1, further comprising forming a pseudo-insulating region around the channel region and the impurity region.

7. The method of manufacturing a compound semiconductor device of claim 1, wherein the forming of the gate electrode and the forming of the connection pad or the wiring layer are performed simultaneously.

8. A method of manufacturing a compound semiconductor device, comprising:

depositing an insulating cover comprising a silicon nitride film on a substrate;

forming on the substrate a source region and a drain region adjacent to a channel region and forming an impurity region underneath an area of the substrate on which a connecting pad is to be formed;

forming a source electrode and a drain electrode;

removing the insulating cover to expose the impurity region;

forming a gate electrode;

forming the connection pad on the exposed impurity region; and attaching a bonding wire to the connection pad.

9. The method of manufacturing a compound semiconductor device of claim 8 or 1, wherein the forming of the source and drain regions and the forming of the impurity region are performed simultaneously by implanting impurities through the insulating cover.

* * * * *